(12) United States Patent
Kanou

(10) Patent No.: US 7,270,552 B2
(45) Date of Patent: Sep. 18, 2007

(54) ELECTRIC CONNECTION BOX

(75) Inventor: Tomoki Kanou, Yokkaichi (JP)

(73) Assignees: Autonetworks Technologies, Ltd., Mie (JP); Sumitomo Wiring Systmes, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/472,267

(22) Filed: Jun. 22, 2006

(65) Prior Publication Data

US 2006/0292903 A1  Dec. 28, 2006

(30) Foreign Application Priority Data

Jun. 23, 2005  (JP) .............................. 2005-183425

(51) Int. Cl.
*H01R 12/00* (2006.01)
(52) U.S. Cl. ...................... 439/76.2; 439/587; 439/474
(58) Field of Classification Search ............... 439/76.2, 439/474, 587
See application file for complete search history.

(56) References Cited

U.S. PATENT DOCUMENTS 7,108,519 B2 * 9/2006 Tomikawa et al. ......... 439/76.2
2004/0001319 A1  1/2004 Kawakita et al.

FOREIGN PATENT DOCUMENTS

JP  A-2004-040873  2/2004

* cited by examiner

*Primary Examiner*—Truc Nguyen
(74) *Attorney, Agent, or Firm*—Oliff & Berridge, PLC

(57) ABSTRACT

An electric connection box provided with a circuit structure, a casing for accommodating the circuit structure therein, a plurality of bus bar terminals disposed on a cabling path crossing the casing in the horizontal direction and electrically connecting the circuit structure and an external connecter to each other, and a terminal support portion for supporting a horizontal portion crossing the casing in the horizontal direction in the plurality of bus bar terminals from below, wherein a partition wall for separating the adjacent horizontal portions from each other is provided on a face of the terminal support portion on the side supporting the horizontal portion.

1 Claim, 5 Drawing Sheets

ELECTRIC CONNECTION BOX

BACKGROUND OF THE INVENTION

1. Field of the Invention

The present invention relates to an electric connection box.

2. Description of the Related Art

As an electric connection box mounted on an automobile or the like, an electric connection box described in Japanese Patent Laid-Open No. 2004-40873 is known. This electric connection box is provided with a circuit board to which a bus bar is bonded and a case for accommodating this circuit board. A plurality of fuse connection terminals and signals are formed on the bus bar. The fuse connection terminals are extended from an upper end of the circuit board and disposed along an upper end face of an intermediate case with their tip ends formed to project upward. On the other hand, the terminals for signal are extended from a lower end of the circuit board and disposed along a bottom surface in the intermediate case with their tip ends formed to project downward.

However, in the above structure, if water caused by rain, washing, etc., intrudes into the case, the water might contact an upper surface of the intermediate case or the bottom surface in the intermediate case, which could result in a short circuit. Particularly, these terminals are often positioned very close to each other due to limitations of space, and in such a case, the above short circuit problem becomes noticeable.

SUMMARY OF THE INVENTION

An object of the present invention, the present invention being applicable to an electric connection box to be mounted on an automobile or the like, is to prevent bus bar terminals disposed in a case of the electric connection box from being short-circuited due to the leakage of water into the box.

A first aspect of the invention is an electric connection box provided with a circuit structure, a casing for accommodating the circuit structure therein, a plurality of bus bar terminals disposed on a cabling path, the terminals crossing the casing in the horizontal direction and electrically connecting the circuit structure and an external connecter to each other, and a terminal support portion for supporting a horizontal portion crossing the casing in the horizontal direction in the plurality of bus bar terminals from below, in which a partition wall for separating the adjacent horizontal portions from each other is provided on a face of the terminal support portion on the side supporting the horizontal portion.

According to the first aspect of the invention, since the horizontal portions of the adjacent bus bar terminals are separated by the partition wall, moisture adhering to one horizontal portion is prevented from reaching the adjacent other horizontal portions. Thus, a short circuit between the adjacent bus bar terminals can be avoided.

In the first aspect of the invention, the "horizontal direction" means a direction substantially perpendicular to the circuit structure and does not necessarily mean "horizontal" using the ground as a reference.

A second aspect of the invention is an electric connection box in which an upper end of the partition wall is located above an upper face of the horizontal portion.

According to the second aspect of the invention, the adjacent horizontal portions are separated by the partition wall which is "higher" than the horizontal portion. By this, even if water adheres to one horizontal portion, the water can be prevented from overriding the partition wall to reach the adjacent other horizontal portions. As a result, a short circuit between the bus bar terminals can be avoided more surely.

Particularly, if the bus terminals are positioned very close to each other and there is little gap between the horizontal portion and the partition wall, the present invention may ensure that water adhering to an upper face of the horizontal portion does not drop into the gap between the horizontal portion and the partition wall, rather, the water overrides the partition wall and reaches the adjacent other horizontal portions. Thus, it is more effective to raise the partition wall higher than the upper face of the horizontal portion.

A third aspect of the invention is an electric connection box in which a displacement restriction portion for restricting inclination and displacement of the horizontal portion by pressing the horizontal portion from above is provided in the casing, and the upper end of the partition wall is brought into contact with a face in the displacement restriction portion opposite to the horizontal portion.

According to the third aspect of the invention, the respective horizontal portions of the bus bar terminals are substantially surrounded by the terminal support portion, displacement restriction portion and partition wall. This configuration stops or significantly reduces the ability of moisture to intrude into this surrounded area, and as such the moisture is difficult to adhere to the horizontal portion. Thus, a short circuit between the bus bar terminals can be avoided more surely.

DETAILED DESCRIPTION OF THE PREFERRED EMBODIMENTS

A first embodiment of the present invention will be described below referring to FIGS. 1 to 5.

Figure 1:
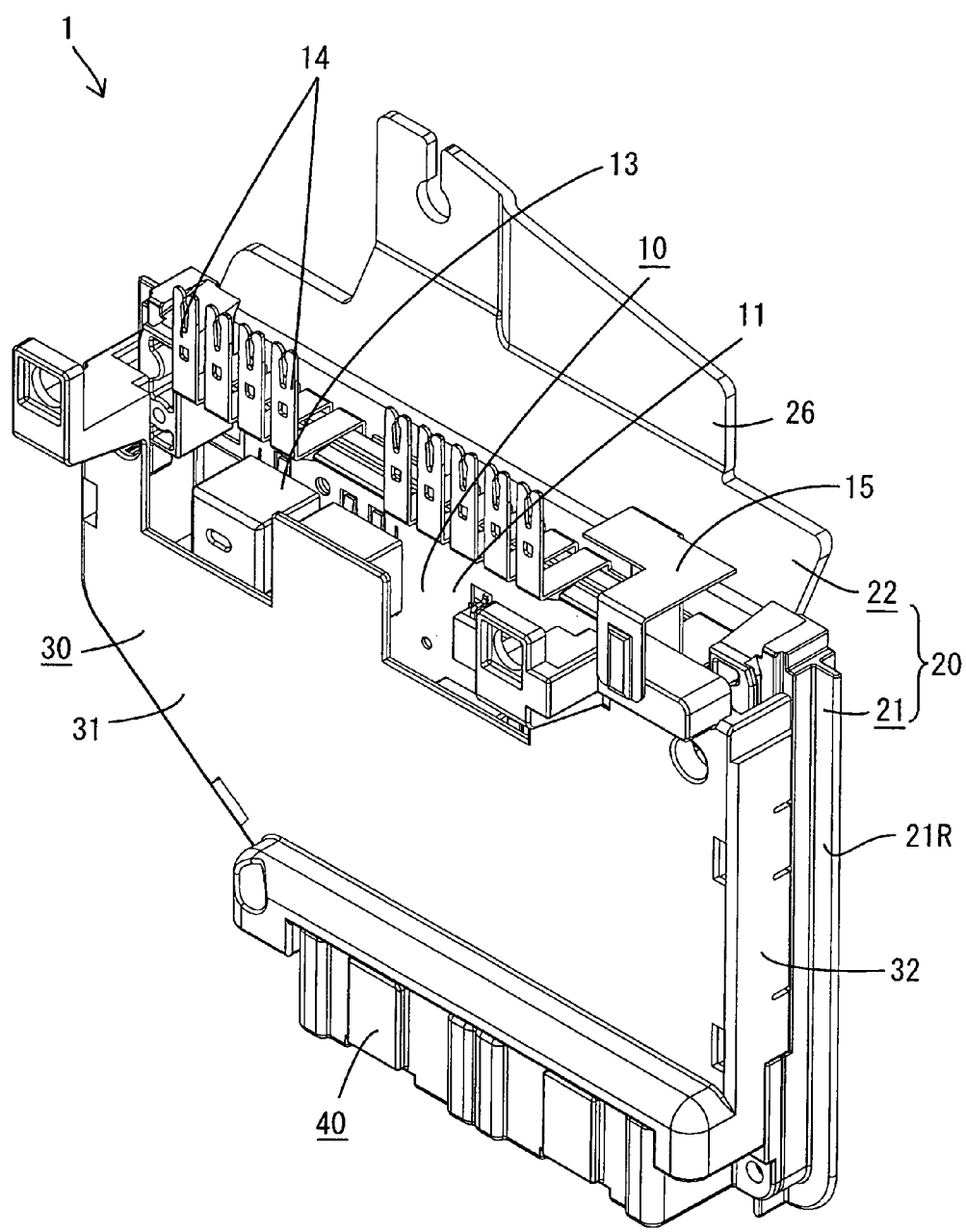
FIG. 1 is an appearance perspective view of an electric connection box in a preferred embodiment.
Figure 2:
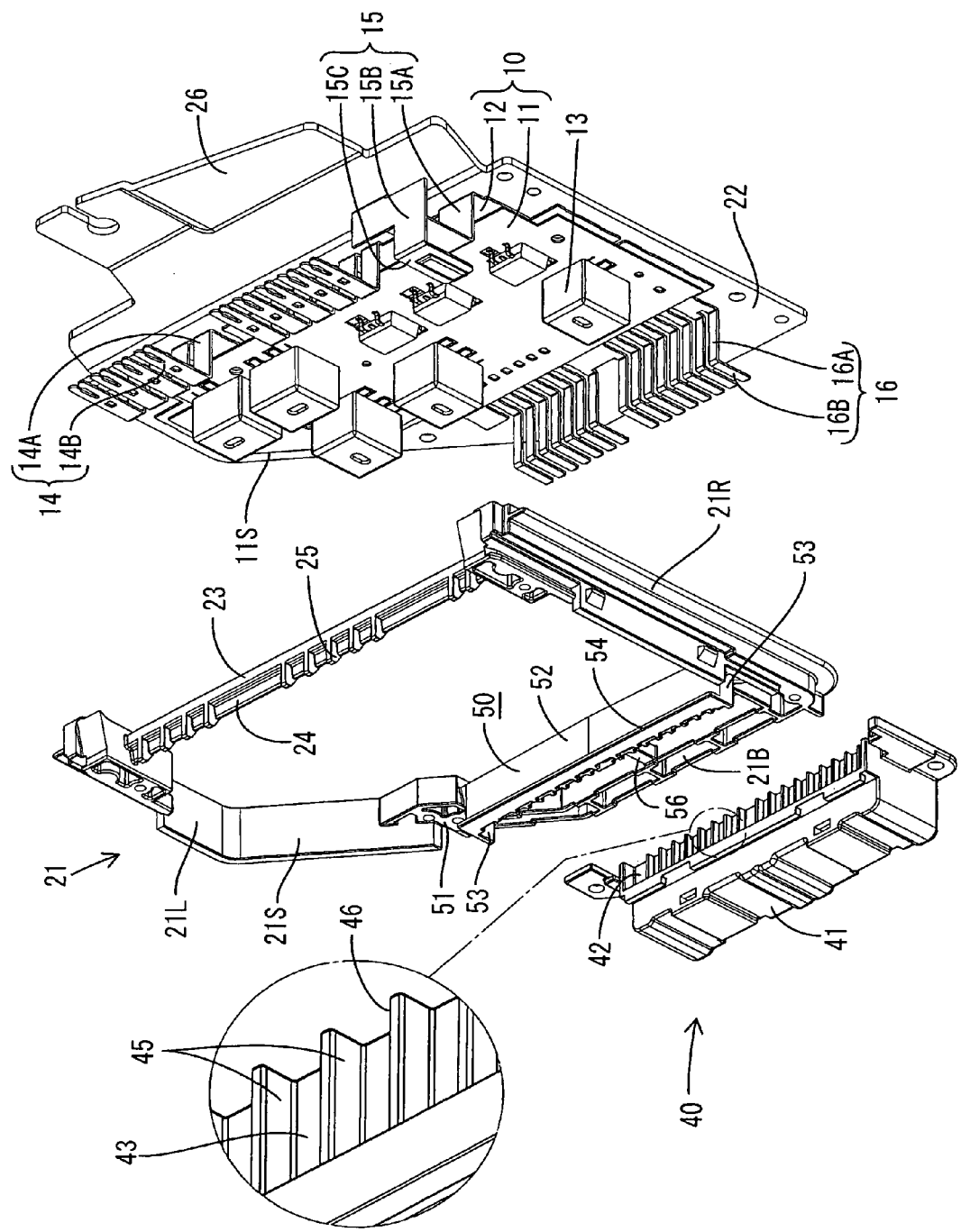
FIG. 2 is an exploded perspective view of the electric connection box before a cover is attached.

FIG. 1 is a perspective view of an appearance of an electric connection box 1 according to this embodiment. FIG. 2 is a perspective view showing a frame body 21 and a lower connector 40 prior to being assembled to a circuit structure 10.

Descriptions of each member of the electric connection box 1 will be described below with the front left side (cover 30 side) referred to as a front side, for the rear right side (case 20 side) as a back side, for the upper side as above, for the lower side as below, for the right side as right and for the left side as left in FIG. 1.

The electric connection box 1 includes the circuit structure 10 provided with a circuit board 11 and a bus bar 12 accommodated vertically within a case 20 comprising the frame body 21 and a radiator plate 22, the front side of the case 20 being covered by the cover 30 as shown in FIGS. 1 and 2.

The circuit board 11 including the circuit structure 10 is in a an area substantially in the left half of its lower edge is made as an inclined edge portion 11S inclined toward the upper edge. On the front of this circuit board 11 is formed a conductor pattern (not shown) including a control circuit. Moreover, on the front of this circuit board 11, a switching member 13 such as a relay is implemented.

On the back face of the circuit board 11, the bus bar 12 is bonded. The bus bar 12 is formed by stamping out a metal plate so as to form a predetermined conductive path to be a power circuit. Bus bar 12 is formed in an outer shape substantially in conformity with the circuit board 11, and a plurality of bus bar terminals 14, 15, 16 to be terminals for connection to an external circuit are disposed on its upper and lower edges.

The upper bus bar terminals 14 (other than the single right-end bus bar terminal 15 disposed on the right end among bus bar terminals 14, 15 arranged on the upper side) rise on the front side forming a substantially right angle with the circuit board 11. That is, the upper bus bar terminal 14 comprises a horizontal portion 14A extending in the horizontal direction from the circuit board 11 and a connection portion 14B extending upward from the extended end of horizontal portion 14A substantially in parallel with the circuit board 11. Note that a slit for fuse insertion is formed at the tip end of this connection portion 14B. The right-end bus bar terminal 15 comprises a horizontal portion 15A extending in the horizontal direction from the circuit board 11, a relay portion 15B extending upward from the extended end of this horizontal portion 15A substantially in parallel with the circuit board 11 and bending to the right and then to the front, and a connection portion 15C protruding downward from the edge on the front side of the relay portion 15B.

In this embodiment, the "horizontal direction" means a direction substantially perpendicular to the circuit structure 10 and does not necessarily mean horizontal to the ground.

The plurality of lower bus bar terminals 16 arranged side by side to the right-and-left direction in an area in the right of the inclined edge portion 11S in the lower edge of the circuit board 11, that is, in an area substantially in parallel with the upper edge, comprises a horizontal portion 16A extending in the horizontal direction from the circuit board 11 and a connection portion 16B extending downward from the extended end of this horizontal portion 16A (end opposite to the side bonded to the circuit structure 10) substantially in parallel with the circuit board 11 (direction crossing the horizontal portion 16A). Note that the plurality of upper bus bar terminals 14 and lower bus bar terminals 16 are positioned as close as possible due to limitations of a space.

Figure 3:
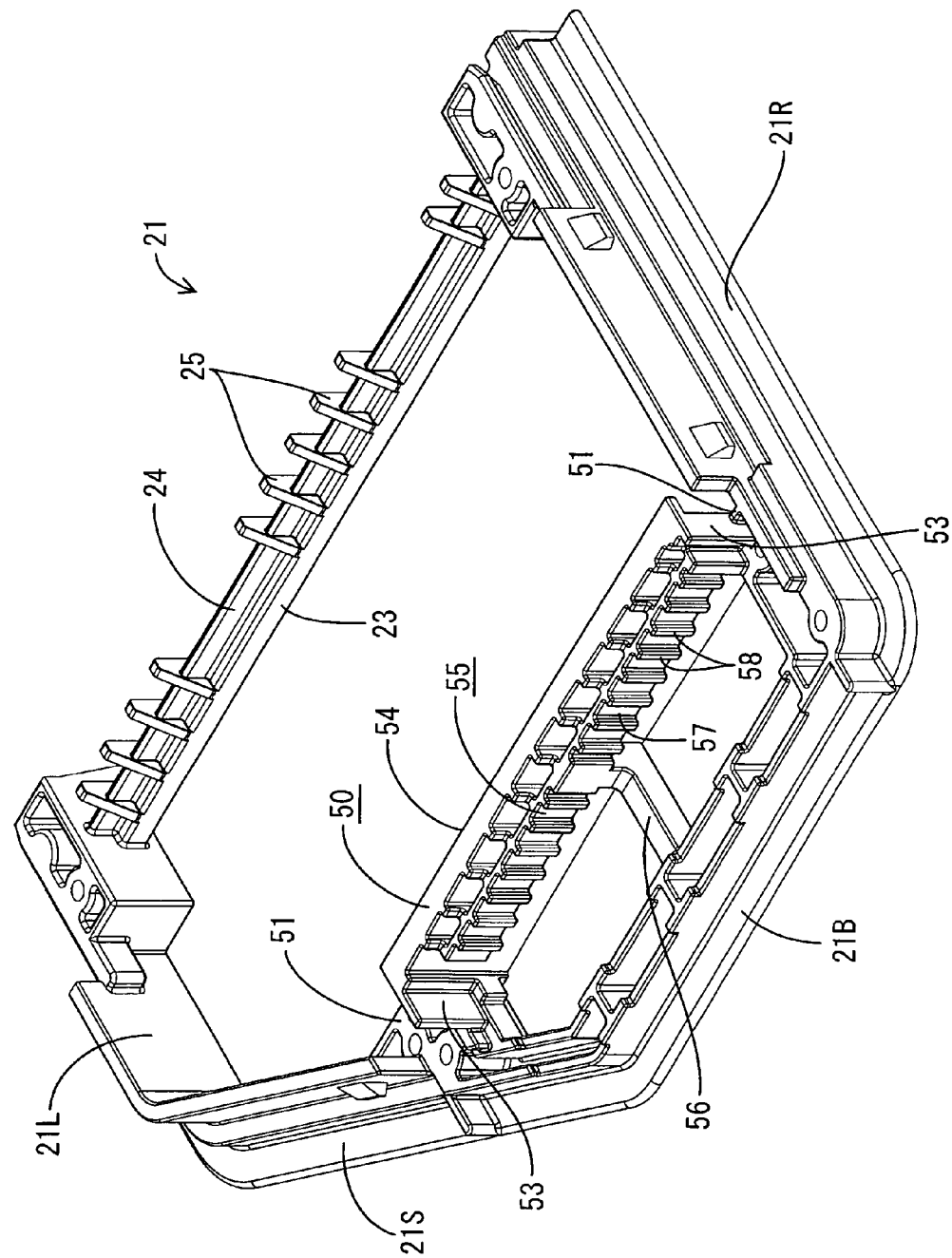
FIG. 3 is a perspective view of a frame body.

FIG. 3 is a perspective view of the frame body 21. As mentioned above, the case 20 accommodating the circuit structure 10 comprises the frame body 21 and the radiator plate 22 (See FIGS. 1 and 4).

As shown in FIG. 3, the frame body 21 is formed by an insulating material such as a synthetic resin. The frame body 21 is formed substantially U-shaped, or substantially following along the lower edge and both the right and left edges among the peripheral edges of the circuit board 11. Specifically, the frame body 21 comprises an inclined frame portion 21S along the inclined edge portion 11S of the circuit board 11, a lower frame portion 21B along an area in the right of the inclined edge portion 11S in the lower edge of the circuit board 11, a left frame portion 21L along the left edge portion of the circuit board 11 and a right frame portion 21R along the right edge portion of the circuit board 11. At an upper part of the frame body 21, a connection portion 23 is provided for connecting the left frame portion 21L and the right frame portion 21R (See also FIG. 2). This connection portion 23 connects the left frame portion 21L and the right frame portion 21R to each other at a position slightly lower than the upper ends of the left frame portion 21L and the right frame portion 21R. The connection portion 23 is formed substantially in a quadrangular prism state. An upper face of the connection portion 23 is brought into contact with a portion of a lower face of the horizontal portion 14A of the upper bus bar terminal 14 closer to the circuit board 11. The connection portion 23 supports the horizontal portions 14A from the lower face side (See also FIG. 4). Moreover, a flange portion 24 is provided at the front of the connection portion 23 (surface opposite to the circuit board 11 side). This flange portion 24 is provided along the length direction of the connection portion 23 substantially at the center position in the vertical direction on the front of the connection portion 23. The flange portion 24 is provided as being extended toward the front side. Moreover, on the front of this connection portion 23, a plurality of plate-state reinforcing portions 25 are formed with the plate direction substantially crossing the length direction of the connection portion 23. This reinforcing portion 25 is provided on the front of the connection portion 23 at positions corresponding to the respective horizontal portion 14A of the upper bus bar terminal 14. And an upper face of each of the reinforcing portions 25 is made flush with the upper face of the connection portion 23. Note that the plate thickness of the reinforcing portion 25 is smaller than the width of the horizontal portion 14A of the upper bus bar terminal 14.

The radiator plate 22 is attached to the frame body 21. The radiator plate 22 is formed by metal with high heat conductivity in a size slightly larger than the circuit board 11 (See also FIG. 2). The radiator plate 22 is assembled to the frame body 21 so as to block an opening on its back side. The radiator plate 22 is bonded on the back face of the bus bar 12 through an insulating adhesive. Moreover, a mounting piece 26 extending stepwise upward on the back face is formed from the upper edge of this radiator plate 22. The electric connection box 1 is mounted, for example, to a vehicle panel through this mounting piece 26 in a vertical attitude with a lower connector 40, which will be described later, faced downward.

The cover 30 is preferably made of a synthetic resin and attached so that an opening on the front side of the case 20 is covered (See FIG. 1). The cover 30 is formed open on the back side and comprises a lid plate portion 31 substantially in the same shape as that of the circuit board 11 and a side wall portion 32 rising toward the back side along both the right and left edges of the lid plate portion 31. The lid plate portion 31 is formed in a plate shape and substantially covers the front side of the circuit board 11. An upper face and a lower face of the cover 30 are open. In the opening on the upper face side of the cover 30, a fuse box (not shown) is mounted. The connection portion 14B of the upper bus bar terminal 14 is inserted into the fuse box, or the like, from below. Moreover, in the opening on the lower face side of the cover 30, the lower connector 40 is mounted.

Figure 4:
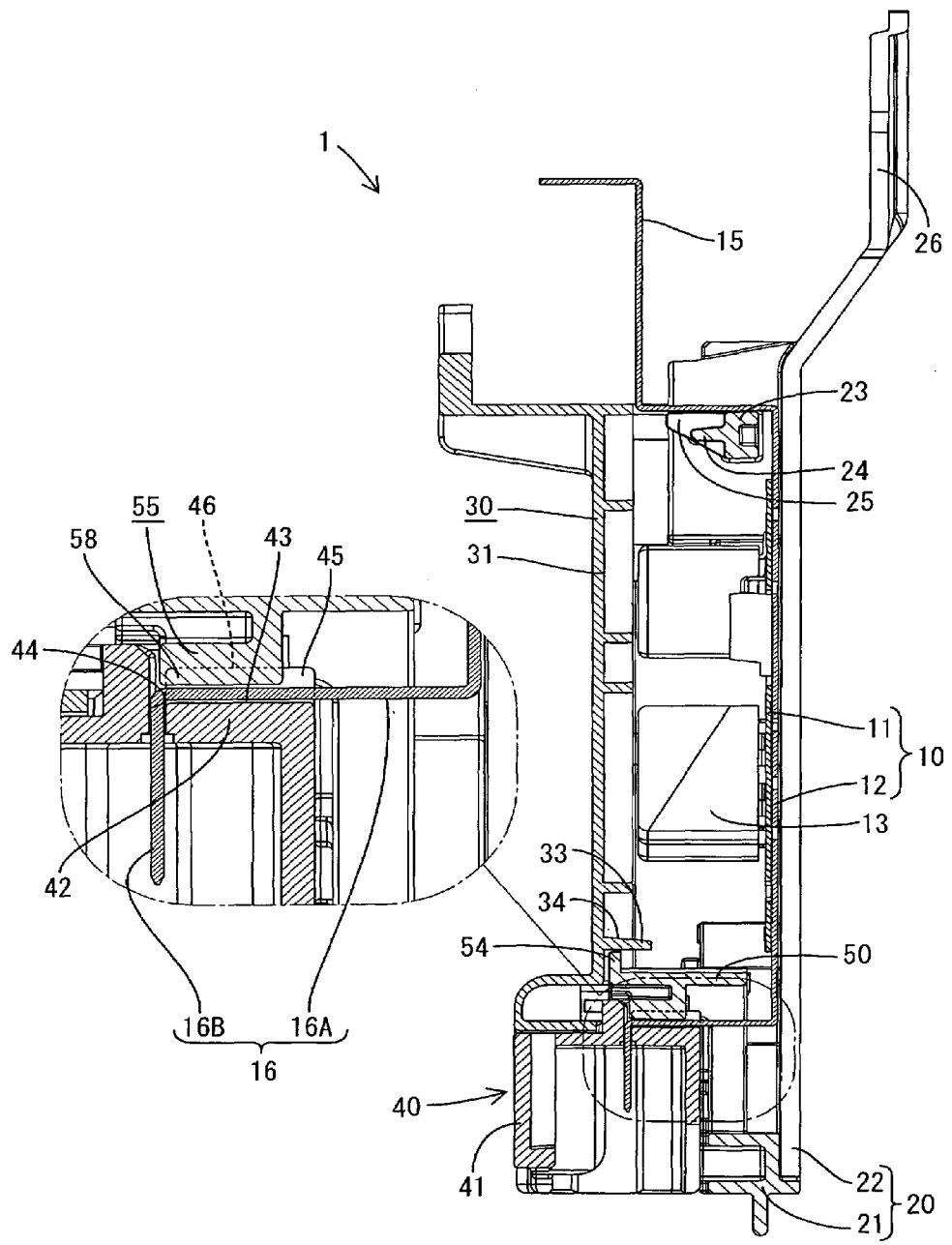
FIG. 4 is a side sectional view of the electric connection box.

FIG. 4 is a side sectional view of the electric connection box 1 according to this embodiment.

As shown in FIG. 4, the lower connector 40 is connected to the lower part of the cover 30. The lower connector 40 is provided with a laterally long housing 41, preferably made of an insulating material such as synthetic resin, and open on the lower face side so that the external connector is able to be fitted to this housing 41 from below.

The lower connector 40 is connected to the lower side of the horizontal portion 16A of the lower bus bar terminal 16. A ceiling portion 42 of the housing 41 supports the horizontal portion 16A from below. That is, the ceiling portion 42 corresponds to the "terminal support portion" of the present invention, and an upper face 43 of the ceiling portion 42 corresponds to the "face of the terminal support portion on the side supporting the plurality of the horizontal portions (16A)" of the present invention.

On the ceiling portion 42 of the housing 41, through holes 43 extending in a vertical direction are provided. Through hole 43 is provided at positions corresponding to the respective connection portions 16B of the lower bus bar terminal 16. The connection portion 16B is accommodated within the housing 41 piercing this through hole 43. The connection portion 16B has its tip end tapered so that it is inserted into the other party terminal (not shown) attached to the external connector.

Figure 5:
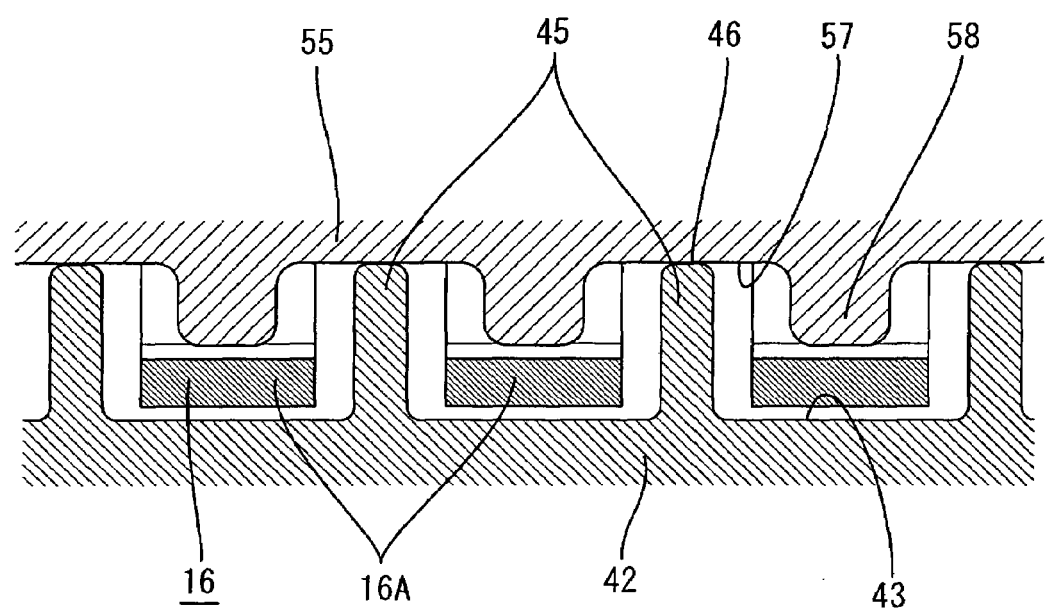
FIG. 5 is a partially enlarged sectional view showing a state where adjacent horizontal portions are separated by partition walls from each other.

FIG. 5 is a partially enlarged sectional view showing adjacent horizontal portions 16A separated by the partition walls 45.

On the upper face 43 of the ceiling portion 42 of the housing 41, the partition walls 45 are separating the adjacent horizontal portions 16A. The partition walls 45 are provided substantially at the center position between the respective horizontal portions 16A on the upper face 43 of the ceiling portion 42. The partition walls 45 are provided projecting upward from the upper face 43 of the ceiling portion 42.

As shown in FIG. 5, an upper end 46 of each of the partition walls 45 is located above the upper face of the horizontal portion 16A. That is, the partition wall 45 is provided as a wall higher than the position of the upper face of the horizontal portion 16A.

The upper end 46 of the partition wall 45 is brought into contact with a lower face 57 of the displacement restriction portion 55. This lower face 57 corresponds to the face in the displacement restriction portion (55) opposite to the horizontal portion (16A) of the present invention.

As shown in FIGS. 2 to 4, at a position above the lower connector 40, a water resistant wall 50 is provided. This water resistant wall 50 is substantially in parallel with the lower frame portion 21B of the frame body 21 and in a plate-state shape. A joint 51 for connecting the water resistant wall 50 to the frame body 21 is provided on both right and left sides of the water resistant wall 50. Specifically, this joint 51 connects a position closer to the lower end of the right frame portion 21R of the frame body 21 to the right end of the water resistant wall 50. Similarly, the joint 51 connects in substantially the center position of the inclined frame portion 21S to the left end of the water resistant wall 50.

The width of the water resistant wall 50 is slightly larger than the area where the horizontal portions 16A of the plural lower bus bar terminals 16 are disposed and the width of the lower connector 40. The end edge of this water resistant wall 50 on the cover 30 side reaches close to the back face of the lid plate portion 31. Also, the end edge of this water resistant wall 50 on the circuit structure 10 side is preferably embedded in a potting material (not shown) covering the front of the circuit board 11.

An upper face of the water resistant wall 50 is a tapered face 52 inclined downward to both right and left ends with substantially the center position in the right-and-left direction as the top of the peak. At both right and left ends of this water resistant wall 50, water resistant side wall portions 53 are provided downward. The lower end of this water resistant side wall portion 53 reaches the ceiling portion 42 of the lower connector 40. This water resistant side wall portion 53 covers the side of the outermost horizontal portion 16A among the horizontal portions 16A of the lower bus bar terminals 16. Also, at the end edge of the water resistant wall 50 on the cover 30 side, a water stop wall 54 is provided upward. This water stop wall 54 protrudes to a position substantially reaching the lower face of a guiding piece 33 provided on the back face of the cover 30. This water stop wall 54 is formed over the entire right-and-left width of the water resistant wall 50.

At a lower part of the water resistant wall 50, a displacement restriction portion 55 is provided integrally (See FIG. 3). This displacement restriction portion 55 restricts upward displacement of the horizontal portions 16A by pressing the horizontal portions 16A from above.

That is, the horizontal portions 16A are pushed upward by fitting of the external connecter into the housing 41. However, in this embodiment, since the upper side of the horizontal portions 16A is pressed by the displacement restriction portion 55, upward displacement of the horizontal portions 16A is restricted.

The displacement restriction portion 55 is formed over a range where the horizontal portions 16A are disposed. A bridge portion 56 is provided between a substantially center portion of the displacement restriction portion 55 in the right-and-left direction and the lower frame portion 21B of the frame body 21. On a lower face 57 of the displacement restriction portion 55 (face opposite to the horizontal portions 16A), ribs 58 are provided at respective positions corresponding to each of the horizontal portions 16A. The lower face of this rib 58 can be brought into contact with each of the horizontal portions 16A from above.

As shown in FIG. 4, the guiding piece 33 is provided on the back face of the cover 30. This guiding piece 33 is provided above the water stop wall 54 and projects from. the back face side of the lid plate portion 31 of the cover 30. And this guiding piece 33 reaches the position slightly beyond above the water stop wall 54 in the direction of the back face. The upper face of this guiding piece 33 is a guiding face 34 inclined downward to the projecting end.

If a liquid, for example, water intrudes into the electric connection box 1 due to rain, car wash, etc., the water might reach the upper face 43 of the lower connector 40 and adhere to the periphery of the horizontal portion 16A of the lower bus bar terminal 16. In this case, water adhering to the periphery of the horizontal portion 16A slides along the upper face of the lower connector 40 and flows to the adjacent other horizontal portions 16A. If the partition wall 45 does not exist between the horizontal portions 16A at this time, water adhering to the periphery of this horizontal portion 16A spreads in the horizontal direction on the upper face 43 of the ceiling portion 42 and there it is likely that the water reaches the adjacent other horizontal portions 16A. Particularly, if a gap between the lower bus bar terminals 16 is designed as narrow as possible due to limitations of space or the like, an interval between the horizontal portions 16A is not sufficient and even a small amount of moisture adhering to the upper face 43 of the lower connector 40 might cause a short circuit between the adjacent lower bus bar terminals 16.

However, according to the electric connection box 1 of this embodiment, since the adjacent horizontal portions 16A are separated by the partition wall 45 from each other, spreading of the water in the horizontal direction is blocked or significantly reduced. Therefore, the water adhering to the periphery of the horizontal portion 16A that otherwise would reach the adjacent other horizontal portions 16A is stopped or significantly reduced, and a short circuit between the lower bus bar terminals 16 can be prevented.

Also, according to the electric connection box 1 of this embodiment, since the upper end 46 of the partition wall 45 reaches a position higher than the upper face of the horizontal portion 16A, the adjacent horizontal portions 16A are divided by the partition wall 45 higher than the horizontal portion 16A. Therefore, even if water adheres to the horizontal portion 16A, the water is prevented from overriding the partition wall 45 and reaching the adjacent other horizontal portions 16A. Thus, a short circuit between the lower bus bar terminals 16 can be prevented more surely.

Particularly, if a gap between the lower bus bar terminals 16 is designed as narrow as possible due to limitations of space or the like as in this embodiment, there is little gap between the horizontal portion 16A and the partition wall 45, and there is a possibility that water adhering to an upper face of the horizontal portion 16A does not drop into the gap between the horizontal portion 16A and the partition wall 45 but overrides the partition wall 45 and reaches the adjacent other horizontal portions 16A.

However, according to the electric connection box 1 of this embodiment, since the partition wall 45 is higher than the horizontal portion 16A, it is difficult for water to override the partition wall 45. Therefore, the moisture adhering to the horizontal portion 16A that otherwise would reach the adjacent other horizontal portions 16A is stopped or significantly reduced, and a short circuit between the lower bus bar terminals 16 can be avoided more surely.

In this way, it is particularly effective to make the partition wall 45 higher than the horizontal portion 16A if the interval between the lower bus bar terminals 16 is small.

Moreover, according to the electric connection box 1 of this embodiment, the upper end 46 of the partition wall 45 is brought into contact with the lower face 57 of the displacement restriction portion 55. Thus, the respective horizontal portions 16A of the lower bus bar terminals 16 are substantially surrounded by the ceiling portion 42, displacement restriction portion 55 and partition wall 45 (See FIG. 5). Since it is difficult for the moisture to intrude into this surrounded area, the moisture that would otherwise adheres to the horizontal portion 16A is stopped or significantly reduced. As a result, a short circuit between the lower bus bar terminals 16 can be avoided more surely.

The present invention is not limited to the embodiments described in the above description and drawings, but the following embodiments, for example, are also included in the technical scope of the present invention, and moreover, various changes other than the following may be made in a range not deviating from the scope of the invention.

(1) In the above embodiment, an example was provided wherein the partition wall 45 is positioned at the ceiling portion 42 (terminal support portion) supporting the horizontal portion 16A of the lower bus bar terminal 16 arranged side by side on the lower end edge of the bus bar 12 from below, but the invention is not limited to this. For example, the partition wall 45 may be provided on a member supporting the horizontal portion 14A of the upper bus bar terminal 14 arranged side by side on the upper end edge of the bus bar 12 from below (the connection portion 23, for example). Thus, a short circuit between the adjacent upper bus bar terminals 14 can be avoided.

(2) Moreover, a slit maybe formed on an outer wall face of the partition wall, for example. By this, it is possible to prevent water from adhering to the horizontal portion from overriding the partition wall and reaching the adjacent other horizontal portions. As a result, a short circuit between the adjacent bus bar terminals can be avoided more surely.

What is claimed is:

1. An electric connection box provided with:
a circuit structure;
a casing for accommodating the circuit structure therein;
a plurality of bus bar terminals disposed on a cabling path crossing the casing in the horizontal direction and electrically connecting the circuit structure and an external connecter to each other; and
a terminal support portion for supporting a plurality of horizontal portions crossing the casing in the horizontal direction in the plurality of bus bar terminals from below, wherein
a partition wall for separating the adjacent horizontal portions from each other is provided on a face of the terminal support portion on the side supporting the horizontal portions;
an upper end of the partition wall is located above an upper face of at least one of the plurality of horizontal portions;
a displacement restriction portion for restricting inclination and displacement of the horizontal portions is provided in the casing; and
the upper end of the partition wall is brought into contact with a face of the displacement restriction portion opposite to the at least one of the plurality of horizontal portions.

* * * * *